(12) United States Patent
Meninger

(10) Patent No.: US 8,519,785 B2
(45) Date of Patent: Aug. 27, 2013

(54) DIFFERENTIAL AMPLIFIER WITH DUTY CYCLE COMPENSATION

(75) Inventor: Scott Meninger, Groton, MA (US)

(73) Assignee: Cavium, Inc., San Jose, CA (US)

( * ) Notice: Subject to any disclaimer, the term of this patent is extended or adjusted under 35 U.S.C. 154(b) by 63 days.

(21) Appl. No.: 13/369,562

(22) Filed: Feb. 9, 2012

(65) Prior Publication Data

US 2012/0206198 A1    Aug. 16, 2012

Related U.S. Application Data

(60) Provisional application No. 61/442,938, filed on Feb. 15, 2011.

(51) Int. Cl.
*H03F 3/45* (2006.01)

(52) U.S. Cl.
USPC ............................................ 330/69; 330/252

(58) Field of Classification Search
USPC .................................. 330/69, 252, 124 R, 295
See application file for complete search history.

(56) References Cited

U.S. PATENT DOCUMENTS

| | | | | |
|---|---|---|---|---|
| 6,653,895 | B1 * | 11/2003 | Douts et al. | 330/9 |
| 6,867,647 | B2 * | 3/2005 | Wouters | 330/69 |
| 7,557,651 | B2 * | 7/2009 | Corsi | 330/69 |
| 7,893,759 | B1 * | 2/2011 | Werking | 330/69 |

* cited by examiner

*Primary Examiner* — Henry Choe

(74) *Attorney, Agent, or Firm* — Hamilton, Brook, Smith & Reynolds, P.C.

(57) ABSTRACT

A differential amplifier replicates the input stage and cross-connects the inputs, so that the input-to-output delay will be balanced in an averaged sense. The outputs of each of the two input stages are then summed after an open loop delay matched inversion has taken place. The result is a reduction in the duty cycle distortion of the receiver amplifier over process voltage and temperature (PVT) variation. This is enabled by the fact that a full swing CMOS delay cell can be made to have good delay matching over PVT, whereas the input stage to a differential amplifier may, depending on architecture, have poor delay matching because of impedance mismatches within the amplifier.

12 Claims, 6 Drawing Sheets

US 8,519,785 B2

DIFFERENTIAL AMPLIFIER WITH DUTY CYCLE COMPENSATION

RELATED APPLICATION(S)

This application claims the benefit of U.S. Provisional Application No. 61/442,938, filed on Feb. 15, 2011. The entire teachings of the above application(s) are incorporated herein by reference.

BACKGROUND

In modern integrated circuit based systems, the need to receive signals at high data rates is challenging. As the data passes through the receiving amplifier, it is filtered by the response of the amplifier and the signal is distorted. One particular type of signal distortion is duty cycle distortion (DCD), which is a measure of how much the average data positive pulse-width differs from the average data negative pulse-width. DCD can become a significant source of timing uncertainty or reduction of timing margin in high speed data links and memory interfaces.

SUMMARY

Depending on the implementation of a differential receiver, the input path from the positive input to the output and negative input to the output may not be balanced from a delay perspective. This is especially true when a differential to single-ended conversion takes place. Embodiments of the present invention replicate the input stage and cross-connects the inputs, so that the input-to-output delay will be balanced in an averaged sense. The outputs of each of the two input stages are then summed after an open loop delay matched inversion has taken place. The result is a reduction in the duty cycle distortion of the receiver amplifier over process voltage and temperature (PVT) variation. This is enabled by the fact that a full swing CMOS delay cell can be made to have good delay matching over PVT, whereas the input stage to a differential amplifier may, depending on architecture, have poor delay matching because of impedance mismatches within the amplifier.

BRIEF DESCRIPTION OF THE DRAWINGS

The foregoing will be apparent from the following more particular description of example embodiments of the invention, as illustrated in the accompanying drawings in which like reference characters refer to the same parts throughout the different views.

The drawings are not necessarily to scale, emphasis instead being placed upon illustrating embodiments of the present invention.

DETAILED DESCRIPTION

A description of example embodiments of the invention follows.

Figure 1:
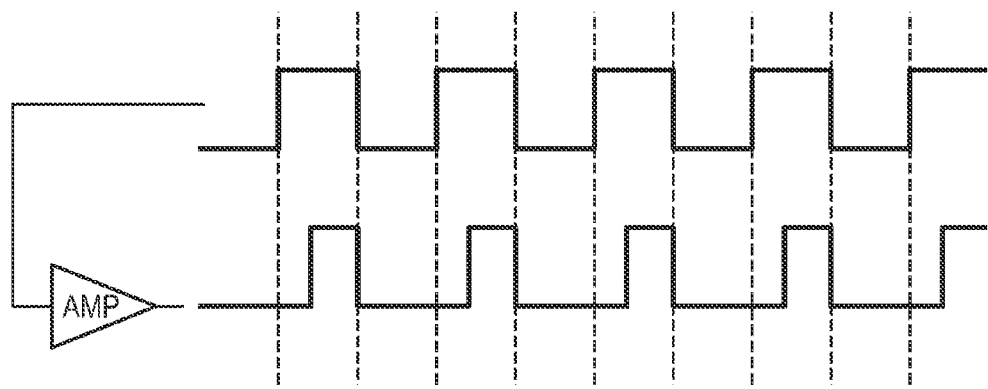
FIG. 1 is a timing diagram of a clock signal with DCD.

FIG. 1 is a timing diagram illustrating the duty cycle distortion (DCD) introduced to a clock signal as a result of being received and retransmitted by an amplifier. In this example, the original signal (at top) has a 50% duty cycle (i.e., equal times in high and low states), which is ideal for many applications requiring a clock signal. After being processed by the amplifier, which may be used as a receiver once the clock has been distributed some distance, or as a transmitter to buffer the clock before distributing it, the duty cycle has been distorted. The signal output of the amplifier (at bottom) is high only 3/10 of the time, resulting in a duty cycle of 0.3. The total DCD may therefore be calculated to be +/−20%. Because both the positive and negative halves of the clock waveform are distorted, half of the distortion can be associated with each half of the waveform in systems where both edges of the clock are used.

Figure 2:
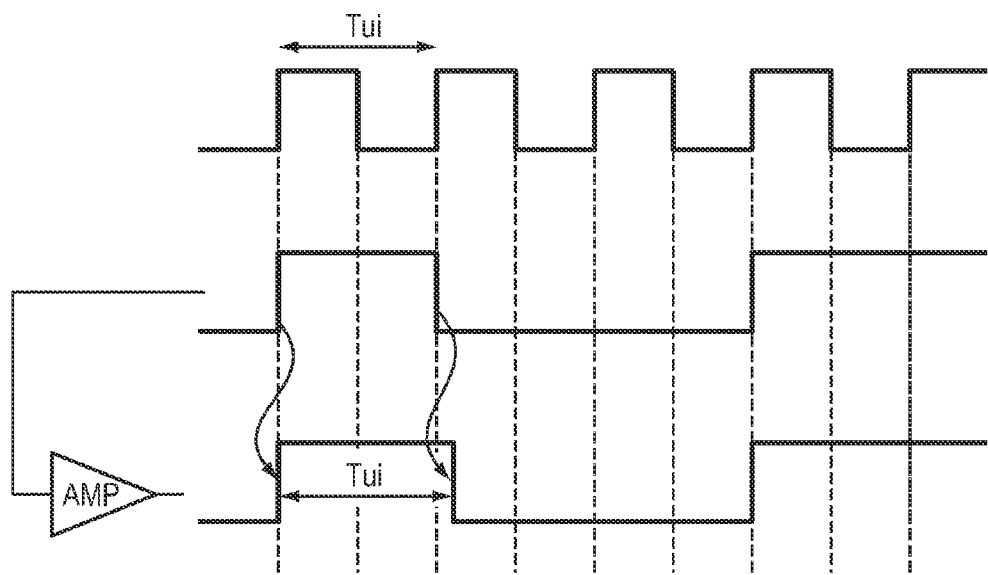
FIG. 2 is a timing diagram of a data signal with DCD.

FIG. 2 is a timing diagram depicting DCD of a data signal. A data signal is shown at an initial state as it is received by an amplifier (second row), and as it is retransmitted by the amplifier (bottom row), against a reference clock signal (top row). Because of the changing nature of data, duty cycle distortion will not appear as a repeating pattern. Rather, it will manifest itself as distortion on a pulse-by-pulse basis. As shown in FIG. 2, the pulse-width of the data coming out of the amplifier, Tdw, is different than that entering the amplifier, Tui. Thus, DCD of a data signal may appear as pulse-width distortion.

Duty cycle distortion may be problematic in several applications, and in particular detracts from timing margins in high-speed serial links and memory interfaces by reducing the amount of timing margin the system has to clock data across the link.

Figure 3:
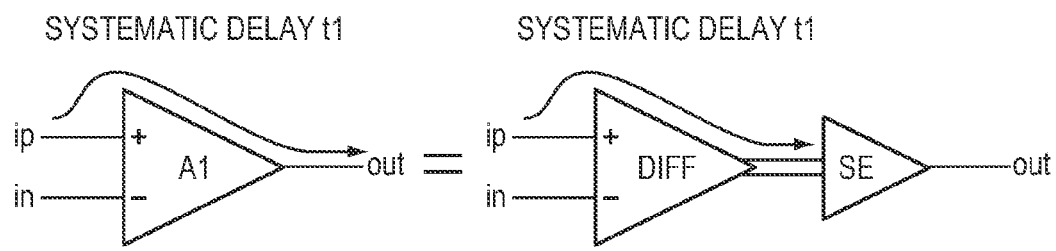
FIG. 3 is diagram of a typical differential amplifier.

FIG. 3 is a circuit diagram illustrating a typical amplifier circuit, A1, which comprises a differential stage, DIFF, and a single-ended output buffer stage SE. Because of biasing internal to the differential stage DIFF, or perhaps inevitable asymmetry that exists in the differential to single-ended conversion from DIFF to SE, there is a systematic delay difference between the path from the positive input "ip" to amplifier A1's output, and negative input "in" and amplifier A1's output. When the signal is then converted to a singled ended signal by SE, the delay difference is converted into duty cycle distortion at the amplifier output "out."

Figure 4:
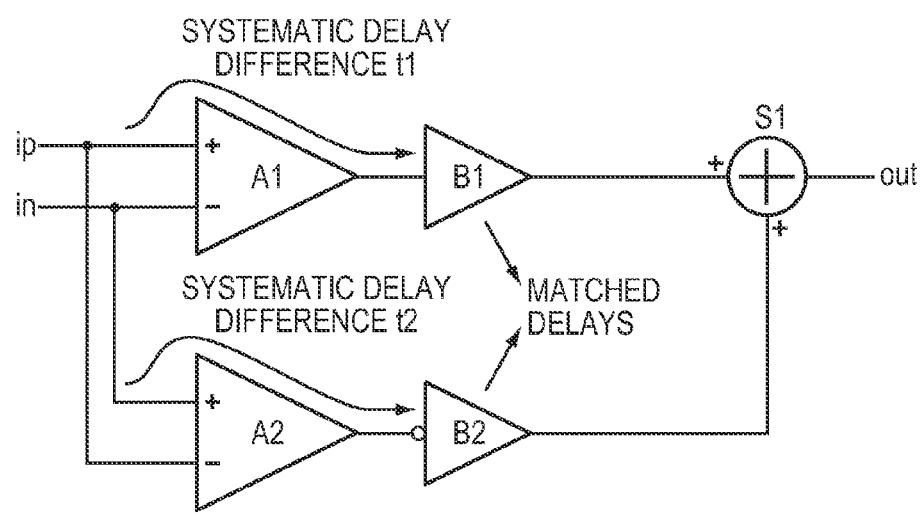
FIG. 4 is a block diagram of a matched differential amplifier with a single-ended output.

FIG. 4 is a circuit diagram illustrating a differential amplifier in an example embodiment of the invention. Matched differential amplifiers A1 and A2 both incur a systematic offset delay from one input to their output. In this figure, the delay from the positive input "ip" to the amplifier output has been chosen for illustrative purposes. This systematic delay difference may be the result of biasing circuitry or differential to single ended conversion inside differential amplifiers A1 and A2.

Once the signals are converted to full-swing, they are passed through full-swing buffers B1 and B2, which are CMOS based. It is very straightforward to get well matched delays across process voltage and temperature using CMOS inverters and have the delay through B2 track B1, while having a signal inversion through B2 relative to B1. The correct signal inversion is required because the signal path through A2 was inverted relative to A1. It is also possible for A1 and A2 to be configured such that inversions B1 and B2 are implicit (i.e., occur within A1 and A2). In such a case, B1 and B2 would be non-inverting matched delay cells. Following the systematic delay path through the amplifiers, it can be seen that now both the positive and negative signal paths see the same nominal delay, and since amplifiers A1 and A2 are matched, and B1 and B2 are configured to track over PVT, only random mismatch in delay comes into play from a duty cycle distortion perspective.

The summation may be done either directly by shorting the outputs of buffers B2 and B1, which correct for the duty cycle error by summing the two paths back together and interpolating the correct edge location for the overall signal, or by using an explicit summation stage, S1. If B2 and B1 are shorted directly (e.g., as shown for example in FIG. 5) CMOS inverters may be used as one particular solution, as their transconductances will add and signal re-composition can be controlled by sizing the inverters appropriately.

The technique described above may be applied to different A1/A2 amplifier architectures. There is a wide variety of differential amplifiers that are used as receivers for differential signals that are required to ultimately produce a single-ended output that will suffer from DCD due to a delay mismatch between the positive and negative signal paths to the output. The amplifier may be multi-stage and the mismatch may come from either biasing or from the differential-to-single-ended conversion.

Figure 5:
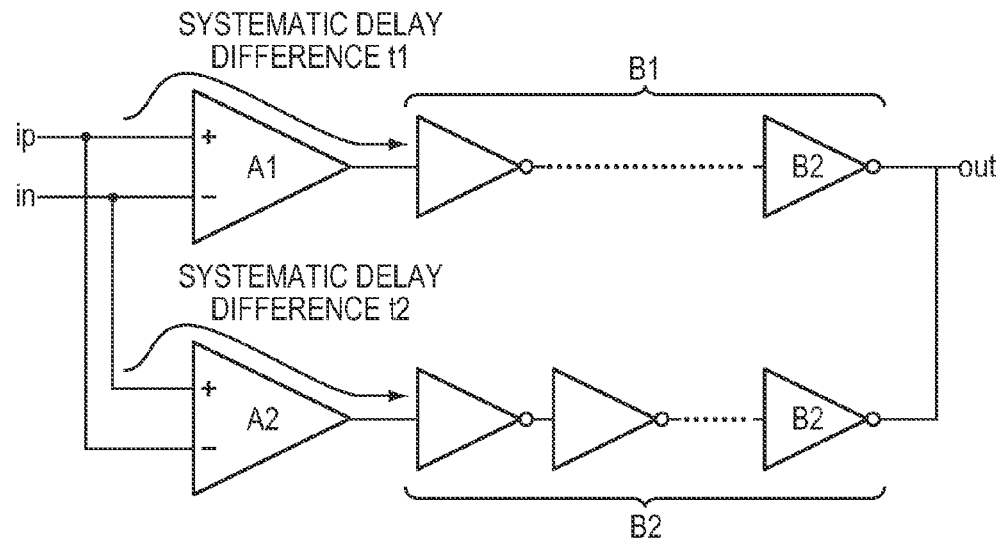
FIG. 5 is a circuit diagram of a matched differential amplifier with a single-ended output.

FIG. 5 is a circuit diagram illustrating a differential amplifier in a further embodiment of the invention. Differential amplifiers A1 and A2 may be of any architecture that contains a differential input and single-ended, full swing output. B1 is comprised of N CMOS inverters, where N is an even number, and B2 is comprised of M CMOS inverters, where M is an odd number.

Because the signal path inputs of A2 are opposite in polarity with respect to A1, A2's full swing output will be opposite in polarity to that of A1. However, the systematic delay of the signal going through A2 is now on the negative part of the signal path, while for A1 it is for the positive part of the signal path. So the systematic delays are balanced to the degree that t1=t2. Since A1 and A2 are identical amplifiers, they are very well matched, and |t1−t2|<<t1,t2. Nominally, t1=t2, and t1−t2=0.

In addition, since B2 is comprised of an odd number of inverters, it will invert A2's output such that B1 and B2 have the same polarity full swing outputs. By constructing B1 and B2 of CMOS inverters, it is very straightforward to scale the sizes of the transistors comprising the individual inverters inside B1 and B2 such that the net delay through B1 matches B2 even though there is a different number of inverters in each overall stage. The simplest design has one more inverter in B2 than in B1.

In order to combine the outputs of B1 and B2 and sum the results, the simplest solution is to short the last inverter stage outputs of B1 and B2 together. Because the signals are nominally delay matched, this shorting has the effect of summing the signals from the two paths and averaging them together. In effect, the transconductance of the two last stage inverters are used to perform the summation.

Figure 6:
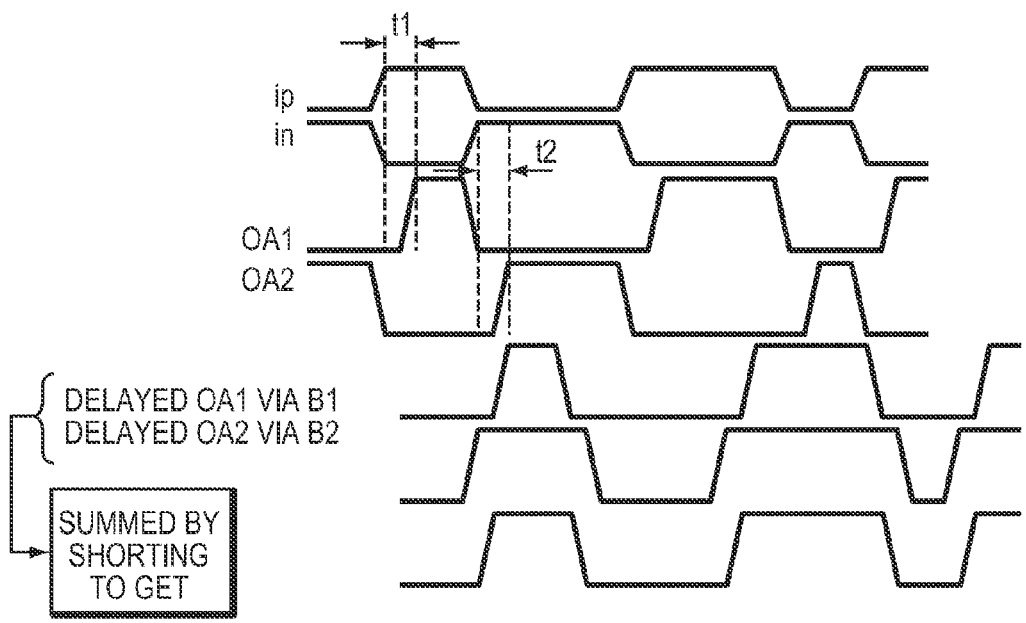
FIG. 6 is a timing diagram of a matched differential amplifier with a single-ended output.

FIG. 6 is a timing diagram illustrating operation of the differential amplifier described above with reference to FIG. 5. Nodes OA1 and OA2 are the outputs of amplifiers A1 and A2, respectively. The input swings on nodes ip and in are depicted as smaller swing than all other signals, which are represented as full-swing, to be consistent with the motivation for the invention; namely, differential to full-swing receiver applications that eventually require a single-ended output.

Because of the systematic propagation delay difference between the positive and negative paths inherent in the amplifier architecture, duty cycle distortion (DCD) is introduced for every positive going edge in the waveform. We see this since the pulses on OA1 and OA2 have shrunk at every positive edge location. Because A1 and A2 are identical, the amount by which the pulses shrink, t1 and t2, are identical. We also state that the total delay through the full-swing CMOS stages B1 and B2 are matched.

After the delay time passing through B1, B2, the signals OA1 and an inverted version of OA2, /OA2, which are the outputs of B1 and B2, are combined to form the output signal, out. In the case where B1 and B2's outputs are shorted, their output signals do not exist individually, so their representation in the timing diagram is a virtual, or mathematical, representation to show where they would occur if the shorting action did not occur.

Once the outputs are shorted, two things happen simultaneously. First, the transconductances of B1 and B2 act in unison to create an overall dual signal path from ip and in to out. Second, an interpolation between the distorted pulses occurs such that t1 and t2 are effectively canceled at the output and a delayed, full-swing version of the original signal appears at the output.

Figure 7:
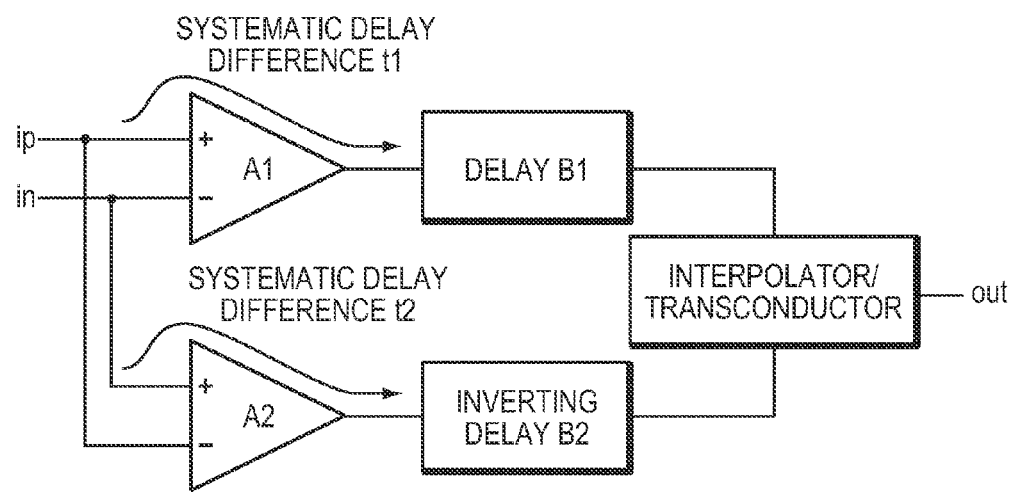
FIG. 7 is a block diagram of a differential amplifier in a further embodiment.

FIG. 7 is a circuit diagram of a differential amplifier in a further embodiment, implementing generic delay stages. The differential amplifier may be configured in a manner comparable to those described above with reference to FIGS. 4-6, wherein the delays B1 and B2 may be programmable or fuse-trimmable to account for various amounts of expected process variation. The delays B1 and B2 may also be comprised of networks other than CMOS elements. The interpolator/transconductor stage may be comprised of different types of interpolators and transconducting elements other than CMOS inverters, such as resitively loaded MOSFETs, differential structures, etc.

Figure 8:
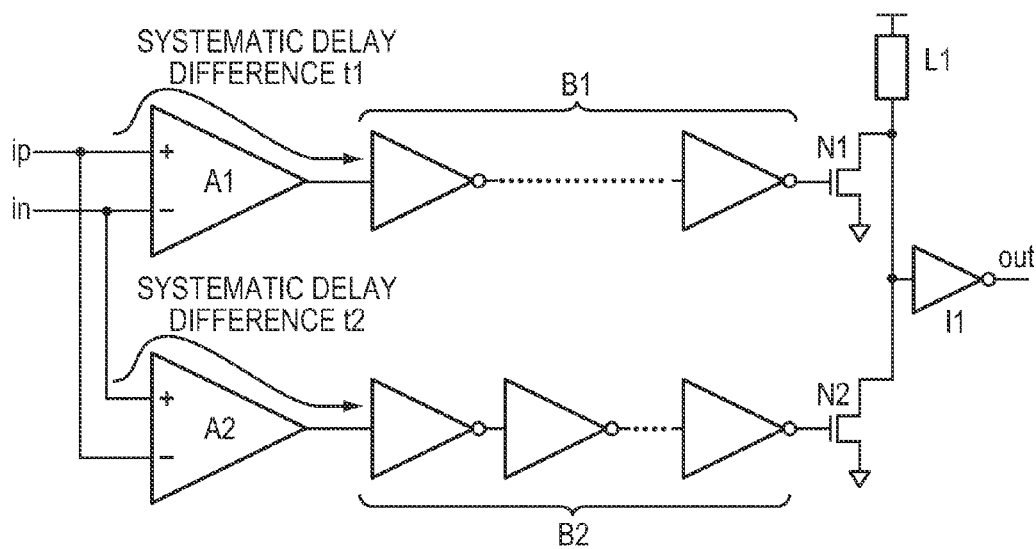
FIG. 8 is a block diagram of a differential amplifier in a further embodiment.

FIG. 8 is a circuit diagram of a differential amplifier in a further embodiment. The amplifier may be configured in a manner comparable to those described above with reference to FIGS. 4-6, yet implementing NMOS-based interpolating/transconductance elements N1, N2 with an output load L1. Inverter I1 ensures full-swing signaling at the output.

Figure 9:
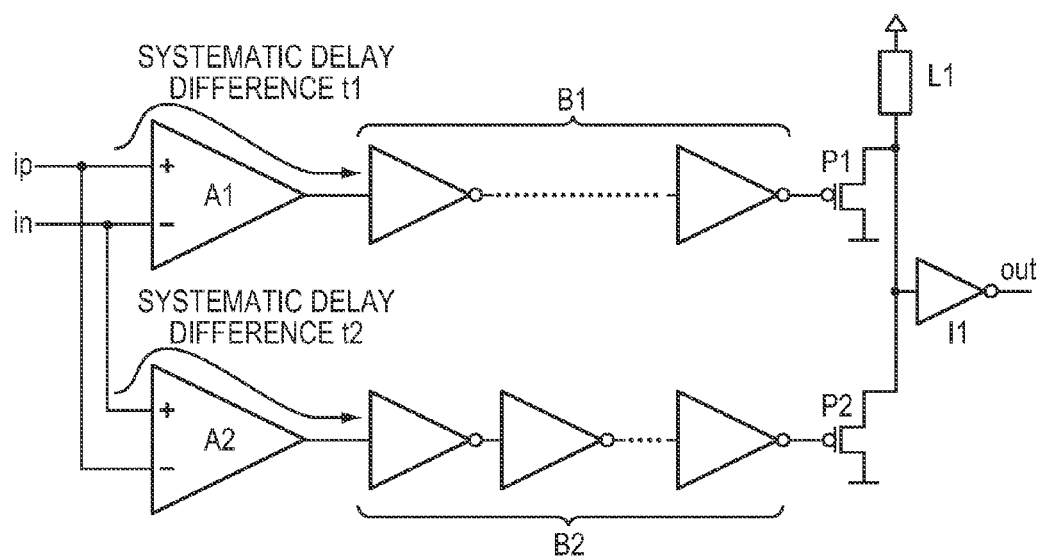
FIG. 9 is a block diagram of a differential amplifier in a further embodiment.

FIG. 9 is a circuit diagram of a differential amplifier in a further embodiment. The amplifier may be configured in a manner comparable to those described above with reference to FIGS. 4-6, yet implementing PMOS-based interpolating/transconductance elements P1, P2 with an output load L1. Inverter I1 ensures full-swing signaling at the output.

Figure 10:
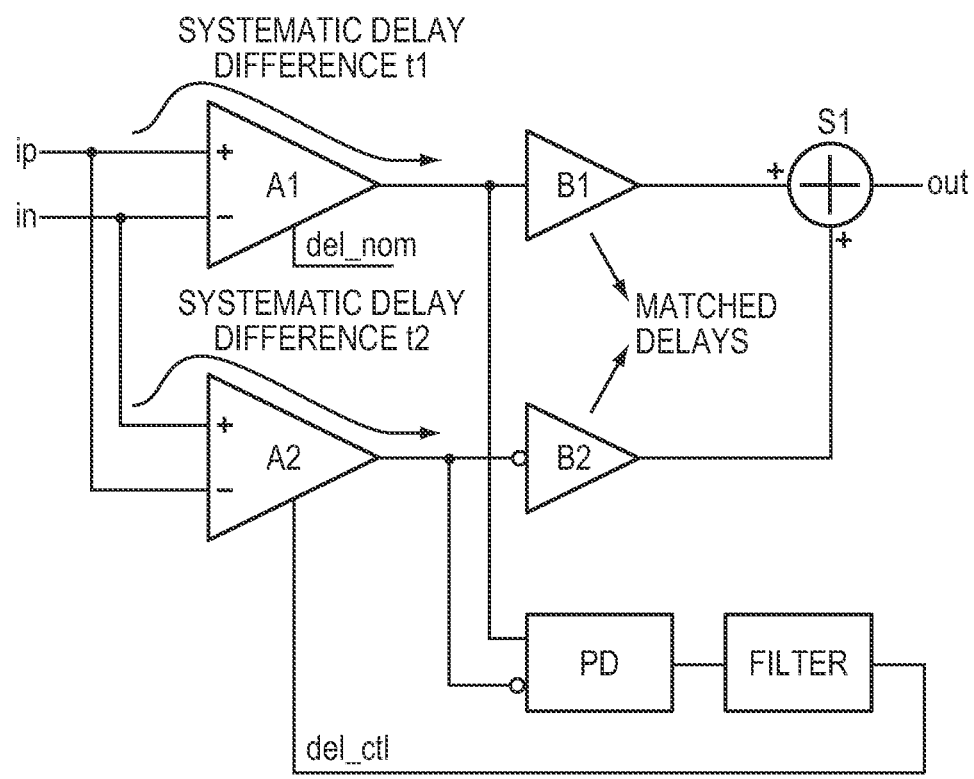
FIG. 10 is a circuit diagram of a differential amplifier in a further embodiment.

FIG. 10 is a circuit diagram of a differential amplifier in a further embodiment. In this case, feedback has been added to ensure that the delays t1 and t2 of the matched amplifiers A1 and A2 are precisely matched, rather than relying on best layout practices and process matching. Phase detector PD detects the difference in arrival times between the edges of the clock or data signals through the matched amplifiers. The phase detector output is then filtered and used to control the delay of the signal through the amplifier A2 via control signal del_ctl. Delay control may be accomplished via many well known techniques, such as controlling the amplifier bias current to the output stage (an analog technique) or controlling the number of fingers in a load device (a digital technique.) The exact implementation details of the feedback loop are not critical, and may be either analog or digital, (for example, the filter may be an analog RC or a digital counter depending on how the delay adjustment in A2 is implemented) but the impact of adding the loop would be to improve on the open loop delay matching between amplifier A1 and A2, further reducing the overall duty cycle distortion. A1 is set to some nominal delay value that is centered at mean expected value based on process simulation, but may be adjusted based on process feedback via fuses (digital) or a DAC (analog), depending on the details of implementation. For very high speed applications where timing budgets are extremely difficult to achieve, this embodiment offers a potential for significant performance improvement.

While this invention has been particularly shown and described with references to example embodiments thereof, it will be understood by those skilled in the art that various changes in form and details may be made therein without departing from the scope of the invention encompassed by the appended claims.

What is claimed is:

1. A circuit comprising:
   a first differential amplifier having a positive input, a negative input and an output;
   a second differential amplifier having a positive input, a negative input and an output, the positive input and negative input of the second differential amplifier cross-connected with the negative input and positive input of the first differential amplifier;
   a first buffer having an input and an output, the input coupled to the output of the first differential amplifier;
   a second buffer having an inverted input and an output, the inverted input coupled to the output of the second differential amplifier, the first buffer and the second buffer having matched delays;
   a summer having first and second positive inputs and an output, the first positive input coupled to the output of the first buffer and the second positive input coupled to the output of the second buffer.

2. The circuit of claim 1, wherein the matched delays include variable delay elements that are adaptable to variation in process, voltage and temperature.

3. The circuit of claim 2, wherein the variable delay elements are adjustable by a programmable control input, the control input having one of an analog or a digital value.

4. The circuit of claim 2, wherein the variable delay elements are adjustable by configuring at least one fuse.

5. The circuit of claim 2, wherein the delay elements are adjusted in response to an output of a phase detector comparing outputs of the matched delays.

6. The circuit of claim 1, wherein the matched delays include delay elements comprising lumped passive elements.

7. The circuit of claim 6, wherein the matched delays further include at least one buffer configured between the lumped passive elements and the output of the matched delays.

8. The circuit of claim 1, wherein the matched delays include delay elements comprising distributed passive elements.

9. The circuit of claim 8, wherein the matched delays further include at least one buffer configured between the distributed passive elements and the output of the matched delays.

10. The circuit of claim 1, wherein the matched delays include bipolar delay elements.

11. The circuit of claim 1, further comprising a phase detector configured to receive and compare phases of the outputs of the first and second differential amplifiers, the first and second differential amplifiers adjusting respective output delays based on an output of the phase detector.

12. A circuit comprising:
   a first input stage comprising a first differential amplifier having differential inputs and a single-ended output, and a first buffer having an input and an output, the output of the first differential amplifier coupled to the input of the first buffer;
   a second input stage comprising a second differential amplifier having differential inputs and a single-ended output, and a second buffer having an inverted input and an output, the output of the second differential amplifier coupled to the inverter input of the second buffer, where the differential inputs of the first differential amplifier and the differential inputs of the second differential amplifier are cross-connected;
   a summer having first and second positive inputs and an output, the first positive input coupled to the output of the first buffer and the second positive input coupled to the output of the second buffer.

* * * * *